United States Patent [19]

Honnorat

[11] Patent Number: 5,419,868

[45] Date of Patent: May 30, 1995

[54] METHOD OF MANUFACTURING PARTS MADE OF A COMPOSITE MATERIAL HAVING A METALLIC MATRIX

[75] Inventor: Yves C. L. A. Honnorat, Gometz la Ville, France

[73] Assignee: Societe Nationale d'Etude et de Construction de Moteurs d'Aviation "SNECMA", Paris, France

[21] Appl. No.: 985,299

[22] Filed: Dec. 4, 1992

[30] Foreign Application Priority Data

Dec. 4, 1991 [FR] France ................. 91 14985

[51] Int. Cl.$^6$ ................. B22F 7/00; C22C 29/00
[52] U.S. Cl. ................. 419/4; 419/14; 419/17
[58] Field of Search ................. 419/4, 14, 17

[56] References Cited

U.S. PATENT DOCUMENTS

| | | | |
|---|---|---|---|
| 4,508,158 | 4/1985 | Amateau et al. | 164/110 |
| 4,680,093 | 7/1987 | Morin | 204/28 |
| 4,685,236 | 8/1987 | May | 42/76.02 |
| 4,731,115 | 3/1988 | Abkowitz et al. | 75/236 |
| 5,171,419 | 12/1992 | Wheeler et al. | 205/176 |
| 5,211,776 | 5/1993 | Weiman | 148/525 |

FOREIGN PATENT DOCUMENTS 0358803 3/1990 European Pat. Off. .
2242441 10/1991 United Kingdom .

OTHER PUBLICATIONS

Patent Abstracts of Japan, vol. 11, No. 133 (C-418), Apr. 25, 1987, & JP-A-61 270 346, Nov. 29, 1986, Oguro Takashi, et al., "Manufacture of Metallic Cylindrical Material Reinforced with Fiber".
Patent Abstracts of Japan, vol. 9, No. 74 (C-273), Apr. 3, 1985, & JP-A-59 208 032, Nov. 26, 1984, Itou Tetsuo, "Fiber Reinforced Compositr Aluminum Material".
Journal of Physics III, Jun. 1991, pp. 1141–1166, M. Lancin, "Relationship Between the Microstructure of the Interface and the Mechanical Behaviour of Composites Materials".
Journal of Metals, Mar. 1984, pp. 19–26, P. R. Smith, et al., "Developments in Titanium Metal Matrix Composites".
Fatigue Fracture of Engineering Material Structure, vol. 14, No. 4, pp. 391–403, 1991, S. J. Wang, et al., "Microscopic Failure Mechanisms of an Unidirectional Glass Fiber Composite".

Primary Examiner—Donald P. Walsh
Assistant Examiner—Scott T. Bluni
Attorney, Agent, or Firm—Oblon, Spivak, McClelland, Maier & Neustadt

[57] ABSTRACT

A method of manufacturing a part made of a composite material having a metallic matrix, for example of titanium or a titanium based alloy, comprises depositing the matrix material on a continuous length of reinforcing fiber, for example of the SiC type, to produce a coating of a predetermined thickness, winding the thus coated fiber onto a former of suitable shape until a desired thickness is obtained, and then heating and isostatically compacting the wound coated fiber to produce the required part.

10 Claims, No Drawings

METHOD OF MANUFACTURING PARTS MADE OF A COMPOSITE MATERIAL HAVING A METALLIC MATRIX

BACKGROUND OF THE INVENTION

1. Field of the invention

The invention relates to a method of manufacturing parts made of a composite material having a metallic matrix.

In the aeronautics industry, and particularly in the construction of aircraft engines, it has long been known to use composite materials comprising reinforcing fibres in a metallic matrix. The advantage of such materials is that they provide tensile strength properties which are enhanced, in proportion to the law of mixtures of fibres and matrix, compared with non-reinforced metallic alloy. This is demonstrated particularly by P. R. SMITH and F. H. FROES in their article published in the JOURNAL OF METALS of March 1984 (19–26), in the case of composites comprising a titanium matrix and silicon carbide fibres. Furthermore, such metallic matrix composite materials, particularly if the matrix is fragile as is the case when it consists for example of a specific compound having an ordered structure such as TiAl or $Ti_3Al$, require more work to break the material, in so far as breakage progresses partially by shearing along the interface between the fibres and the matrix, as shown by M. LANCIN in JOURNAL DE PHYSIQUE III (1991 - No. 6 - 1141 to 1166). This increase in breaking stress results in fact from the exposure of consecutive fibres to the propagation of the breakage by decohesion of the fibre/matrix interface between the rupture planes of each of the fibres.

S. J. WANG et al have, in the article published under FATIGUE FRACT. ENG. MAT. STRUC. Vol. 14 No. 4-1991 (391–403), demonstrated that when the fibres are regularly distributed throughout the matrix, rupture under traction parallel to the fibres of a composite material having a metallic matrix with a uni-directional fibre reinforcement is propagated from one fibre rupture plane to another by this mode of shearing of the fibre/matrix interface, but that when the volumetric fraction is locally higher than the average, the fibre adjacent a broken fibre is, in the vicinity of the rupture plane, subjected to a concentration of stress which encourages rupture of the latter in the same plane as before and, by degrees, a plane rupture is observed which is associated with a small amount of work by the traction forces.

2. Summary of the Prior Art

The techniques currently employed in order to produce large size axi-symmetrical parts from a composite having a titanium or titanium-based alloy matrix reinforced by silicon carbide fibres are disclosed in French Patent No. 2 289 425 in the name of SNECMA and in French Patent No. 2 366 904 in the name of ARMINES.

A first method consists of winding onto a former the fibre which is to constitute the reinforcement, so that it forms a layer on the former, and then making a plasma deposition of the material which is to constitute the matrix on the said fibre layer. These two stages of winding and plasma deposition are then repeated as many times as required, and the resulting structure is finally compacted under heat.

The disadvantage with this method is that it does not allow an equidistant disposition of the fibres in the material due to the need to carry out two inclined plasma depositions for each fibre layer in order that the metallic matrix is able to fill in the gaps between the turns of the wound fibre, and then a third plasma deposition in a radial direction relative to the former in order to cover the fibre layer with metallic matrix material before winding-on the next layer of fibre. Defects in parallelism are observed, and also a lack of uniformity in thickness between successive layers. The method is difficult to perform.

A second known method, in addition to winding fibre onto a former, comprises applying to each wound layer of fibre a sheet of the metallic matrix material. A particular drawback of this method is the risk of not having the fibres in each layer equidistant, due to the fact that the wound-on fibres tend to slip in respect of one another. Further drawbacks are the risk of the sheet of matrix material becoming creased, the risk of not uniformly covering the fibres of each layer, and the difficulty of producing satisfactory successive stackings and correct junctions at the ends of the sheets. Furthermore, the structure of the end product, after compaction of the fibre and sheet stack under heat, incorporates localised stress concentrations which adversely affect the satisfactory life of the product in the severe environments for which it is intended.

SUMMARY OF THE INVENTION

It is an object of the present invention to overcome the drawbacks of the above described processes by providing a method which is easier to carry out and which avoids reactive diffusion within the final product and avoids localised stress concentrations by ensuring sufficient and uniform fibre separation and an homogeneous fibre distribution within the matrix.

To this end, according to the invention there is provided a method of manufacturing a part made of a composite material having a metallic matrix, comprising the steps of:

(a) depositing said metallic matrix material on a continuous length of reinforcing fibre to produce a coating of said metallic matrix material of regular and defined thickness on said reinforcing fibre;

(b) spirally winding said coated reinforcing fibre onto a former of appropriate shape to produce a plurality of layers of said coated reinforcing fibre on said former;

(c) covering said layers on said former in a fluid-tight manner using a metallic outer jacket of appropriate shape and then heating and isostatically compacting said covered layers; and (d) removing said jacket and said former to obtain said part.

In a preferred embodiment of the invention, the reinforcing fibre is of a ceramic material, for example silicon carbide, and in the first stage of the process, titanium or a titanium based alloy, for example $TiAl_6V_4$, or even a titanium based specific intermetallic compound of ordered structure, is deposited on the fibre.

The deposition may be performed by any suitable known technique, such as by vapour phase deposition in an electrical field, or by a method involving steeping the fibre in a metallic bath, or by electrophoresis using metallic powders.

In order to obtain a product which is homogeneous after compaction under heat, the matrix material deposit must be of a thickness sufficient for the turns of the ceramic fibre not to touch one another after compaction, but such that the interstices present between the layers of coated fibres and between the turns in each layer, after winding, are sufficiently small that these interstices are filled by the matrix material during the compaction under heat. Preferably, the coating of the matrix material formed on the fibre is of a thickness determined as a function of the diameter D of the fibre and the respective mechanical characteristics of the fibre and the matrix. For example, for silicon carbide fibres marketed under the name TEXTRON and having a diameter of approximately 150 μm, the deposit of titanium or a titanium alloy may be about 75 μm thick, which corresponds to a matrix deposit of a volume substantially equal to that of the fibre.

The invention will now be described more clearly by reference to the following non-limitative example.

DESCRIPTION OF THE PREFERRED EMBODIMENT

This example of carrying out the method in accordance with the invention seeks to produce a compressor drum which can be used in the construction of an aircraft engine, the drum having a titanium matrix reinforced by silicon carbide (SIC) fibres.

Starting with a continuous silicon carbide fibre of indefinite length, the following steps are carried out:
  continuous deposition of titanium or a titanium-based alloy onto the SiC fibre in a PVD reactor to form a coating along the length of the fibre having a volume per unit length which is substantially equal to that of the fibre;
  placing a first metallic jacket element on a former, the outer surface of the jacket element corresponding to the interior surface of the compressor drum to be produced;
  spirally winding several layers of the titanium or titanium-alloy coated fibre onto the metallic jacket on the former;
  application to the assembly obtained in the previous stage of any cores which may be needed to form bosses and/or recesses on the outer surface of the compressor drum to be produced, the cores being covered with a metallic jacket;
  using a second metallic jacket element to cover in a fluid-tight manner the entire shape resulting from the previous stage;
  isostatic compaction, under heat, of the assembly obtained from the previous stage; and
  removal of the jackets and cores to recover the desired produced.

Certain operations may advantageously be automated, particularly the coating of the fibre in the reactor, whereby the chemical composition and the thickness of the deposit may be regulated, and also the winding of the coated fibre onto the jacketed former.

The deposition stage may alternatively be carried out by steeping the fibre in a metallic bath or by electrophoresis using metallic powders.

The metallic matrix material may alternatively be based on specific inter-metallic compounds having an ordered structure, particularly titanium based compounds, and the method in accordance with the invention may be applied to any metallic matrix coated refractory fibre.

The operation of removing the metallic jackets after compaction may have recourse to chemical dissolution or machining operations in a known manner.

The thickness e of matrix material to be deposited on the fibre of diameter D is a function of the volumetric fraction $V_f$ of fibre in the uni-directional composite constituted by the winding of the coated fibre and the compaction. Now, $V_f$ is itself a function of the mechanical characteristics of the fibres and of the matrix. Therefore, the thickness e can be expressed as a function of the said mechanical characteristics, as will be demonstrated below:

Let l be the uniform spacing of the fibres in a compact stack of square mesh. Assuming an homogeneous coating of the matrix material on the fibre prior to winding, $$l^2 = \frac{\pi (D + e)^2}{4} \quad (1)$$

Having regard to conservation of the volume of matrix material deposited, it is possible, by translating the geometry of the compacted structure, to write $$l^2 = \frac{\pi D^2}{4 V_f} \quad (2)$$

The combination of (1) and (2) results in $$e = \frac{D(1 - \sqrt{V_f})}{\sqrt{V_f}} \quad (3)$$

With regard to the expression of $V_f$, it is considered that the composite effect is obtained if the tensile breaking strength of the composite $(Rm)_c$ is greater than that of the matrix material alone, $(Rm)_m$. Let $\sigma m$ be the tensile stress on the matrix during application of a traction loading to the composite at the breaking stress $(Rm)_f$ of the fibres. The homogeneity of deformation of the composite leads us to write:

$$(Rm)_c = V_f(Rm)_f + (1 - V_f)\sigma m \quad (4)$$

If k is the admissible overload factor in the composite in relation to the matrix, $$(R_m)_c = (1 + k)(R_m)_m \quad (5)$$

Combining equations (4) and (5) gives us $$V_f = \frac{(1 + k)(R_m)_m - \sigma m}{(Rm)_f - \sigma m} \quad (6)$$

By introducing the expression (6) for Vf into equation (3) it is possible to deduce, as a function of the respective mechanical characteristics of the fibre and of the matrix, the thickness e of the deposit to be made on the fibre in order to arrive at a specific overload factor k.

Thus, for example, the thickness e of the alloy Ti Al (6) V(4) to be deposited on a SiC fibre of reference SCS6 produced by the TEXTRON Company in order to obtain a composite capable of withstanding a tensile load 1 which is six times greater than that which can be withstood by the matrix alone can be calculated in microns by knowing that:
  for a fibre of diameter D=140 μm, breakage occurs at a loading $(Rm)_f$ of 3400 MPa with an elongation of 0.1%; and
  for the matrix, $(Rm)_m$=990 MPa and $\sigma M$=460 MPa.

The calculations according to the equations (3) and (6) produce
Vf=38.2%
e=80 μm The method in accordance with the invention makes it possible to produce parts displaying an equi-distant distribution of fibres throughout the matrix with no localised concentration of stresses and with far fewer difficulties and at less cost than with the prior art methods discussed earlier.

I claim:

1. A method of manufacturing a part made of a composite material having a metallic matrix, comprising the steps of:
   (a) depositing said metallic matrix material on a continuous length of reinforcing fibre to produce a coating of said metallic matrix material of regular and defined thickness on said reinforcing fibre;
   (b) spirally winding said coated reinforcing fibre onto a former of appropriate shape to produce a plurality of layers of said coated reinforcing fibre on said former;
   (c) covering said layers on said former in a fluid-tight manner using a metallic outer jacket of appropriate shape and then heating and isostatically compacting said covered layers; and
   (d) removing said jacket and said former to obtain said part.

2. A method according to claim 1, wherein said metallic matrix material is deposited in step (a) by vapour phase deposition under an electrical field.

3. A method according to claim 1, wherein said metallic matrix material is deposited in step (a) by steeping in a metallic bath.

4. A method according to claim 1, wherein said metallic matrix material is deposited in step (a) by electrophoresis using metallic powders.

5. A method according to claim 1, wherein the thickness of the coating of said metallic matrix material formed on said reinforcing fibre in step (a) is such that the individual turns of said fibre do not come into contact with one another when said layers of said spirally wound fibre are heated and isostatically compacted in step (c).

6. A method according to claim 5, wherein the thickness of said coating of said metallic matrix material formed on said reinforcing fibre is determined as a function of the diameter D of said fibre and the respective mechanical characteristics of said fibre and said matrix.

7. A method according to claim 1, wherein said reinforcing fibre is a ceramic fibre.

8. A method according to claim 7, wherein said reinforcing fibre is made of silicon carbide.

9. A method according to claim 1, wherein said metallic matrix material is titanium, a titanium-based alloy, or a specific compound having a titanium-based ordered structure.

10. A method of manufacturing a part made of a composite material having a metallic matrix, comprising the steps of:
   (a) depositing said metallic matrix material on a continuous length of reinforcing fibre to produce a coating of said metallic matrix material of regular and defined thickness on said reinforcing fibre;
   (b) placing on a former of appropriate shape a metallic inner jacket element of which the outer surface corresponds to the interior surface of the part to be produced;
   (c) spirally winding said coated reinforcing fibre onto said inner jacket element on said former to produce a plurality of layers of said coated reinforcing fibre on said inner jacket element;
   (d) applying cores covered with a metallic jacket on the assembly resulting from step (c) in order to form bosses and/or recesses on the outer surface of the part to be produced;
   (e) covering said layers of said coated reinforcing fibre on said inner jacket element in a fluid-tight manner using a metallic outer jacket of appropriate shape and then heating and isostatically compacting said covered layers; and
   (f) removing said inner and outer jackets and said cores to obtain said part.

* * * * *

UNITED STATES PATENT AND TRADEMARK OFFICE
CERTIFICATE OF CORRECTION

PATENT NO. : 5,419,868
DATED : May 30, 1995
INVENTOR(S) : METHOD OF MANUFACTURING PARTS MADE OF COMPOSITE MATERIAL HAVING A METALLIC MATRIX

It is certified that error appears in the above-identified patent and that said Letters Patent is hereby corrected as shown below:

Column 2, line 66, "the-matrix" should read --the matrix--.
Column 3, line 25, "SIC" should read --SiC--.

Signed and Sealed this

Ninth Day of July, 1996

Attest:

BRUCE LEHMAN

*Attesting Officer*      *Commissioner of Patents and Trademarks*